United States Patent
Lu et al.

(10) Patent No.: US 9,536,798 B2
(45) Date of Patent: *Jan. 3, 2017

(54) PACKAGE STRUCTURE AND THE METHOD TO FABRICATE THEREOF

(75) Inventors: Bau-Ru Lu, Changhua County (TW); Jeng-Jen Li, Taipei (TW); Kun-Hong Shih, Hsinchu (TW); Kaipeng Chiang, Taoyuan County (TW)

(73) Assignee: CYNTEC CO., LTD., Hsinchu (TW)

( * ) Notice: Subject to any disclaimer, the term of this patent is extended or adjusted under 35 U.S.C. 154(b) by 119 days.

This patent is subject to a terminal disclaimer.

(21) Appl. No.: 13/401,853

(22) Filed: Feb. 22, 2012

(65) Prior Publication Data

US 2013/0213704 A1 Aug. 22, 2013

(51) Int. Cl.
*H05K 1/03* (2006.01)
*H01L 23/13* (2006.01)
(Continued)

(52) U.S. Cl.
CPC ......... *H01L 23/13* (2013.01); *H01L 23/49827* (2013.01); *H01L 23/49833* (2013.01);
(Continued)

(58) Field of Classification Search
CPC .. H05K 3/3415; H05K 3/3421; H05K 3/3431; H05K 3/36; H05K 3/46; H05K 1/0254; H05K 1/0286; H05K 1/0287; H05K 1/0289; H05K 1/0292; H05K 1/0293; H05K 1/0296; H05K 1/0206; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092;H05K 2201/095; H05K 2201/09509; H05K 2201/09518; H05K 2201/09527; H05K 2201/09536; H05K 2201/09554; H05K 2201/09581; H05K 2201/096; H05K 2201/09609; H05K 2201/09618; H05K 2201/09627; H05K 2201/09636; H05K 2201/09809; H05K 2201/09818; H05K 2201/09827; H05K 2201/09836; H05K 2201/09845; H05K 1/021; H05K 1/186; H05K 2201/00; H01L 2924/01079; H01L 2924/01078; H01L 23/5226; H01L 23/13; H01L 2224/16225; H01L 2924/15321; H01L 21/563; H01L 24/16; H01L 23/49827; H01L 23/49833; H01L 2924/13091; H01L 2924/13055; Y10T 29/49124
(Continued)

(56) References Cited

U.S. PATENT DOCUMENTS 5,166,773 A * 11/1992 Temple et al. ............... 257/678
5,426,263 A * 6/1995 Potter et al. ................. 174/558
(Continued)

*Primary Examiner* — Angel R Estrada
*Assistant Examiner* — Pete Lee
(74) *Attorney, Agent, or Firm* — Min-Lee Teng; Litron Patent & Trademark Office

(57) ABSTRACT

The invention discloses a package structure made of the combination of a device carrier and a modifiable substrate. In one embodiment, a recess is formed in the device carrier and a conductive element is disposed on the substrate, wherein the substrate is disposed on the device carrier and the conductive element is located in the recess of the device carrier. The conductive pattern in the substrate is electrically connected to the device carrier and I/O terminals of the first conductive element. The invention also discloses a method for manufacturing a package structure made of the combi-
(Continued)

nation of a device carrier and a modifiable substrate. In one embodiment, a portion of the conductive pattern in the substrate can be modified.

11 Claims, 4 Drawing Sheets

(51) Int. Cl.
    *H05K 1/02*     (2006.01)
    *H05K 1/18*     (2006.01)
    *H01L 23/498*     (2006.01)
    *H01L 21/56*     (2006.01)
    *H01L 23/00*     (2006.01)

(52) U.S. Cl.
    CPC ............. *H05K 1/021* (2013.01); *H05K 1/186* (2013.01); *H01L 21/563* (2013.01); *H01L 24/16* (2013.01); *H01L 2224/16225* (2013.01); *H01L 2924/13055* (2013.01); *H01L 2924/13091* (2013.01); *H01L 2924/15321* (2013.01); *Y10T 29/49124* (2015.01)

(58) Field of Classification Search
    USPC .................................................. 174/260–266
    See application file for complete search history.

(56) References Cited

U.S. PATENT DOCUMENTS

| | | | | |
|---|---|---|---|---|
| 6,057,593 | A * | 5/2000 | Iovdalsky et al. ............ | 257/659 |
| 7,375,974 | B2 * | 5/2008 | Kirigaya .............. | H05K 1/0203 174/520 |
| 7,528,482 | B2 * | 5/2009 | Huang .................... | H01L 23/36 257/710 |
| 7,800,916 | B2 * | 9/2010 | Blackwell et al. ........... | 361/790 |
| 7,808,798 | B2 * | 10/2010 | Cotte et al. .................... | 361/763 |
| 8,362,607 | B2 * | 1/2013 | Scheid et al. ................. | 257/707 |
| 8,436,457 | B2 * | 5/2013 | Crisp et al. .................... | 257/686 |
| 2005/0265670 | A1 * | 12/2005 | Sasser et al. ................... | 385/92 |
| 2006/0186531 | A1 * | 8/2006 | Hsu .............................. | 257/700 |
| 2007/0218257 | A1 * | 9/2007 | Ambo ................. | H01R 9/2466 428/209 |
| 2008/0308917 | A1 * | 12/2008 | Pressel et al. ................. | 257/676 |
| 2010/0277881 | A1 * | 11/2010 | Russell ......................... | 361/761 |
| 2011/0068354 | A1 * | 3/2011 | Tran et al. ...................... | 257/89 |
| 2011/0088936 | A1 * | 4/2011 | Schaaf ............... | H01L 23/3677 174/260 |
| 2011/0216515 | A1 * | 9/2011 | Lee .......................... | B32B 38/04 361/762 |
| 2011/0303440 | A1 * | 12/2011 | Lim ..................... | H05K 1/0203 174/255 |
| 2012/0068359 | A1 * | 3/2012 | Mori ................. | H01L 23/49827 257/774 |

* cited by examiner

PACKAGE STRUCTURE AND THE METHOD TO FABRICATE THEREOF

BACKGROUND OF THE INVENTION

I. Field of the Invention

The present invention relates to a package structure and, in particular, to a package structure made of the combination of a device carrier and a modifiable substrate.

II. Description of the Prior Art

Lead frame is a material for IC package and can be in variety of forms such as QFP, TSOP, SOT or SOJ. The molded semiconductor devices are constructed by assembling and interconnecting a semiconductor device to a lead frame. The structure is often molded with plastic material. A lead frame is made by a metal ribbon with a paddle (also known as a die paddle, die-attach tab, or island) for attaching a semiconductor device thereto and a plurality of leads arranged in a manner such that the leads do not overlap the paddle on which the semiconductor device is to be mounted.

Conventionally, lead frame is used for die bond of an IC chip. The process flow includes many stages which are wire bond, molding of IC chip, and the tests after trimming or forming. Various products can be made by integrating or packaging the lead frame with other devices such as inductors or capacitors. It's one of the main package processes in the industry due to its easiness, maturity and better reliability. However, such kind of conventional process has many disadvantages including: a. higher cost and more development works of molding devices; b. poor capability in area design which is only in the form of plane so that product size doesn't shrink; c. lacking of modular capability as it is only good for packaging a single device; and d. poor performance in heat dissipation.

Conventionally, if the conductive pattern in the package structure needs to be modified or changed, it can't be repaired in the conductive pattern locally. Moreover, the package structure can't be easily disassembled and combined. Accordingly, the present invention proposes a package structure and its manufacturing method to overcome the above-mentioned disadvantages.

SUMMARY OF THE INVENTION

One objective of the present invention is to provide a package structure comprising: a device carrier; a recess in the device carrier; a substrate having a conductive pattern therein; and a first conductive element having at least one first I/O terminal, disposed on the substrate; wherein the substrate is disposed on the device carrier and at least one portion of the first conductive element is located in the recess of the device carrier; and the conductive pattern in the substrate is electrically connected to the device carrier and said at least one first I/O terminal of the first conductive element.

A plurality of conductive elements can be buried in the package structure so that the module size of the package structure can be reduced. The package structure can make shorter electrical paths so that it can reduce total impedance and increase electrical efficiency.

The device carrier can be a PCB, a ceramic substrate, a metallic substrate, a lead frame, and so on. There can be a conductive pattern in, on or underlying the device carrier for external electrical connections. A first conductive element is encapsulated mainly in the recess of the device carrier, not molded with plastic material conventionally. There can be also a conductive pattern in, on or underlying the substrate for external electrical connections. The substrate can be a PCB, a ceramic substrate, and so on.

A second conductive element can be mounted on the substrate by SMT. The first conductive element and the second conductive element can be active elements, such as IC chip, MOSFET, IGBT or diode, or passive elements, such as resistors, capacitors or inductors. An insulating layer is formed between the device carrier and the substrate. In one embodiment, an insulating layer is also filled in the recess of the device carrier and encapsulates the first conductive element.

Because the conductive pattern has been patterned in the substrate in an earlier process such as PCB manufacturing process which is much cheaper than film process (lithography process) or printing process, it can reduce cost significantly.

The substrate is modifiable or replaceable. In one embodiment, if there is a failure of the conductive pattern in the substrate, the substrate can be removed and a portion of the conductive pattern in the substrate can be repaired or modified. In one embodiment, a portion of the conductive pattern in the substrate can be repaired or modified without removing the substrate from the package structure. In one embodiment, the substrate can be replaced with the another substrate having another conductive pattern therein in order to have better package structure and better electrical performance.

Another objective of the present invention is to provide a package structure having at least one third conductive element disposed in the vacancy of the substrate. The third conductive element can be a resistor. In one embodiment, the device carriers can be disposed on both top surface and bottom surface of the substrate. In one embodiment, the substrates can be disposed on both top surface and bottom surface of the device carrier. In one embodiment of the present invention is to provide a method for manufacturing a package structure.

The main advantages of the package structure in the present invention are described as follows:
(a) Compared with lead frame and molding in conventional structure of IC package, the device carrier is directly electrically connected to the conductive pattern in the substrate. It doesn't need complex patterning process directly on the device carrier.
(b) The substrate is a modifiable or replaceable substrate described as above.
(c) Dispensing or gluing is used to replace molding encapsulation for protection of the first conductive element. Therefore, it does not need additional development of molding devices; it can save time and cost; and it's easier for design.
(d) The device carrier can be metallic and has better performance in heat dissipation and electrical conductance than a PCB.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description and they are not intended to limit the scope of the present invention.

Figure 1A:
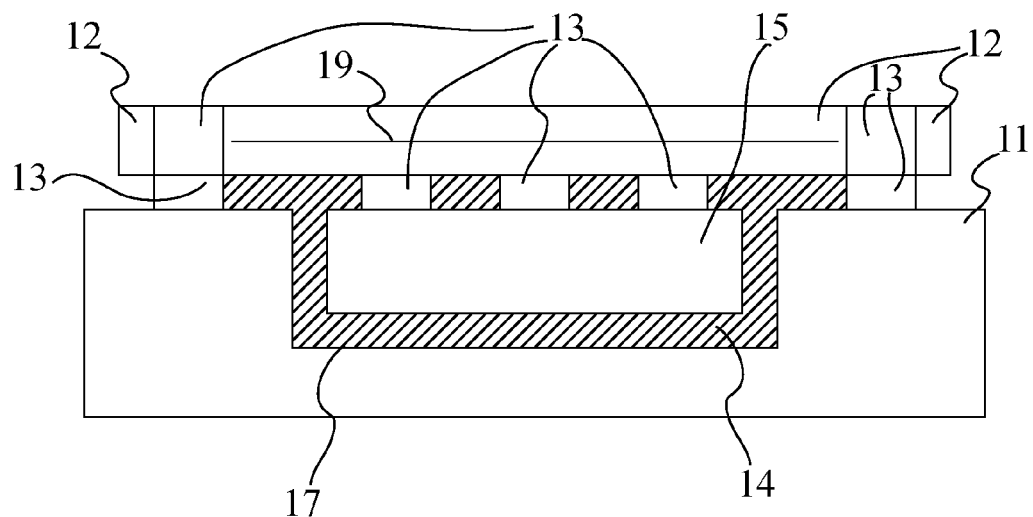
FIG. 1A illustrates a schematic cross-sectional view of a package structure.

To make the following description clear in the present invention, some words inclined to be confusing are defined in the beginning. A device carrier means an object on which at least one device is disposed. Depending on size, shape or location of the device, the device carrier can have any suitable appearance The invention discloses a package structure made of the combination of a device carrier and a modifiable substrate. FIG. 1A illustrates a schematic cross-sectional view of the package structure 10. The structure 10 includes a device carrier 11, a substrate 12, a conductive pattern 13, an insulating layer 14, and a first conductive element 15.

A device carrier 11 has a conductive pattern (not shown) therein and a plurality of pads (as I/O terminals) (not shown) for external electrical connections. In one embodiment, the pads can be placed in any suitable locations of the package structure 10. The pads can be disposed underlying the device carrier 11 or on the substrate 12 for making an optimized package structure. The device carrier 11 can be a PCB, a ceramic substrate, a metallic substrate, a lead frame, and so on. In one embodiment, the device carrier 11 (such as a metallic substrate, a lead frame) has at least one vacancy (not shown). The vacancy can be filled with any suitable filling layer (not shown), such as an insulating layer. Appearance or shape of the device carrier 11 and the substrate 12 depends on layout of the pads via which the package structure 10 is electrically connected to a PCB or another conductive element (not shown), such as IC chip, MOSFET, IGBT, diode, resistor, choke or capacitor. In one embodiment, the device carrier 11 comprises a plurality of sub device carriers, wherein the plurality of sub device carriers are joined together.

The device carrier 11 has at least one recess 17 therein. The recess 17 is formed by removing one or more portions of the device carrier 11. At least one portion of the first conductive element 15 (e.g., IC chip, MOSFET, IGBT, diode, resistor, choke or capacitor) is located in the recess 17. There are many different ways to locate the recess 17, for example, in one embodiment the recess 17 is formed inside of the device carrier 11; in another embodiment, the recess 17 is formed with one side aligned with one edge of the device carrier 11; and in yet another embodiment, the recess 17 is formed with two sides aligned with two edges of the device carrier 11 respectively. In one embodiment, the recess 17 can be formed in the device carrier 11 which comprises a plurality of sub device carriers, wherein the plurality of sub device carriers are joined together.

A substrate 12 is placed on the device carrier 11 (e.g., down set). The substrate 12 comprises a conductive pattern 13 to electrically connect with the device carrier 11 and at least one I/O terminal of the first conductive element 15. There can be direct electrical connection between the first conductive element 15 and the device carrier 11. There can be also non-direct electrical connection between the first conductive element 15 and the device carrier 11. In one embodiment (shown in FIG. 1A), the first conductive element 15 is electrically insulated from the device carrier 11 by filling an insulating layer 14 between the first conductive element 15 and the device carrier 11. In one embodiment, the conductive element 15 is electrically connected to the device carrier 11 via the conductive pattern 13 in the substrate 12. In one embodiment, at least one conductive layer (not shown) is formed between the device carrier 11 and the substrate 12 to have better electrical performance. In one embodiment, the substrate 12 comprises a plurality of sub substrates to make better performance of electrical connections, wherein the plurality of sub substrates are joined together.

In one embodiment, the substrate 12 can include a metallic plate 19, wherein the metallic plate is electrically coupled to one of the plurality of I/O pads of the package structure 10 and isolated from any of the conductive elements in the package structure to reduce the interference from external electro-magnetic wave to the conductive elements.

The substrate 12 can be a PCB, a ceramic substrate, and so on. An insulating layer 14 is formed between the device carrier 11 and the substrate 12. The insulating layer 14 is also filled in the recess 17 of the device carrier 11 and encapsulates the first conductive element 15. In one embodiment, the insulating layer 14 and the filling layer (applied in the vacancy of the device carrier 11 previously) can be the same layer.

Because the conductive pattern 13 has been patterned in the substrate 12 in an earlier predefined stage, it doesn't need complex patterning process, such as film process (lithography process) or printing process directly on the device carrier 11 to form a conductive pattern (not shown), wherein the conductive pattern (not shown) is electrically connected with at least one I/O terminal of the first conductive element 15, at least one I/O terminal of second conductive element 18 (described hereafter) or the device carrier 11. Therefore, it can save the cost of additional patterning process. The substrate 12 is a modifiable or replaceable substrate. In one embodiment, if there is a failure of the conductive pattern 13 in the substrate 12, the substrate 12 can be removed and a portion of the conductive pattern 13 in the substrate 12 can be repaired or modified. Then, the substrate 12 can be re-combined with the device carrier 11. In one embodiment, a portion of the conductive pattern 13 in the substrate 12 can be repaired or modified without removing the substrate 12 from the package structure. In one embodiment, if the conductive pattern 13 in the substrate 12 needs to be changed or modified, the substrate 12 can be replaced with another substrate (not shown) having another conductive pattern (not shown) therein in order to have better package structure and better electrical performance. The conductive pattern (not shown) in said another substrate (not shown) is electrically connected to the device carrier 11 and said at least one first I/O terminal of the first conductive Element 15.

Figure 1B:
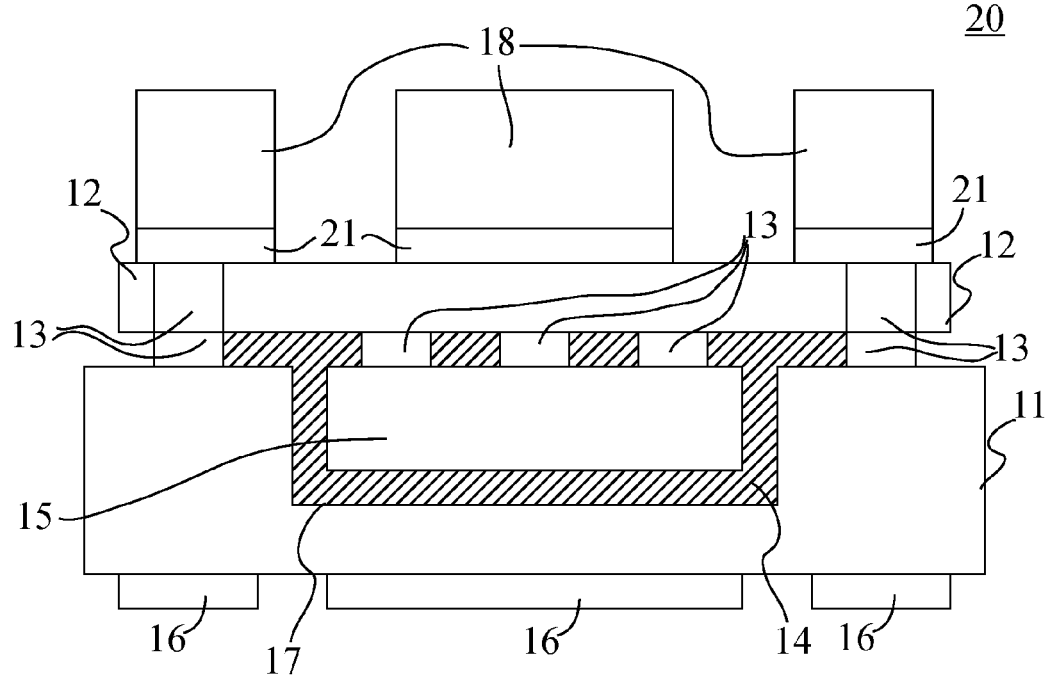
FIG. 1B illustrates a product structure having at least one second conductive element on the structure as shown in FIG. 1A.

FIG. 1B illustrates a product structure 20 having at least one second conductive element 18 on the structure 10 as shown in FIG. 1A. Compared with the structure 10, the product structure 20 further includes at least one second conductive element 18 on the substrate 12. A plurality of first pads 21 can be formed on the substrate 12 by conventional technology, such as film process, printing process or a combination thereof, so that the second conductive element 18 (e.g., IC chip, MOSFET, IGBT, diode, resistor, choke or capacitor) can be disposed on the first pads 21. In one embodiment, at least one conductive layer (not shown) can be formed between the first pads 21 and the substrate 12 to have better performance of electrical connection. A plurality of second pads 16 are disposed underlying the device carrier 11 for external electrical connection. The first pads 21 and the second pads 16 can be made of any conductive material, such as Sn, Ni/Au or the like. The structure 20 can be mounted on a PCB or electrically connected to another conductive element (not shown) (e.g., IC chip, MOSFET, IGBT, diode, resistor, choke or capacitor) so that the second conductive element 18 can be electrically connected to the PCB or another conductive element (not shown) via the conductive path including the first pads 21, the conductive pattern 13, the device carrier 11, and the second pads 16. It should be noted that the way to make electrical connections varies with different kinds of products or process performed on the device carrier 11. It can include many ways and is not limited to the ways described above. It can be readily appreciated by those skilled in the art and thus will not be further described herein.

Figure 1C:
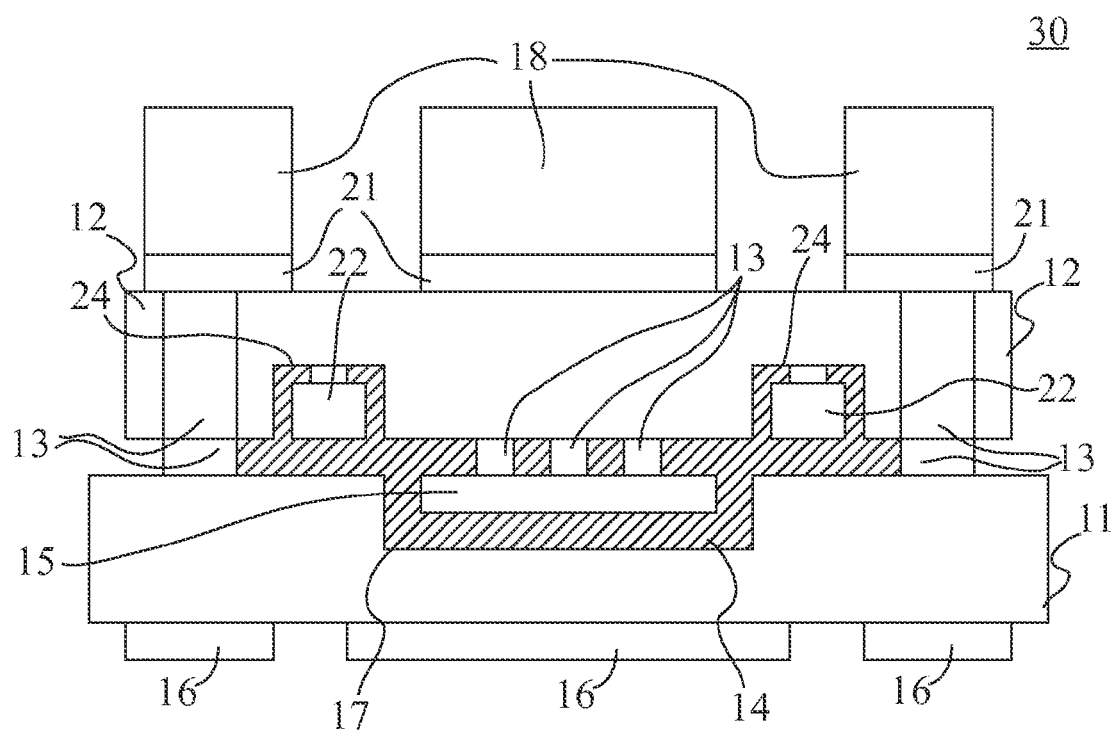
FIG. 1C illustrates another product structure having at least one third conductive element.

FIG. 1C illustrates another product structure 30 having at least one third conductive element 22. Compared with the structure 10, at least one third conductive element 22 is disposed in the vacancy (or recess) 24 of the substrate 12. The third conductive element 22 can be a resistor. The features described above can also be applied to the structure 30 in FIG. 1C.

Figure 1D:
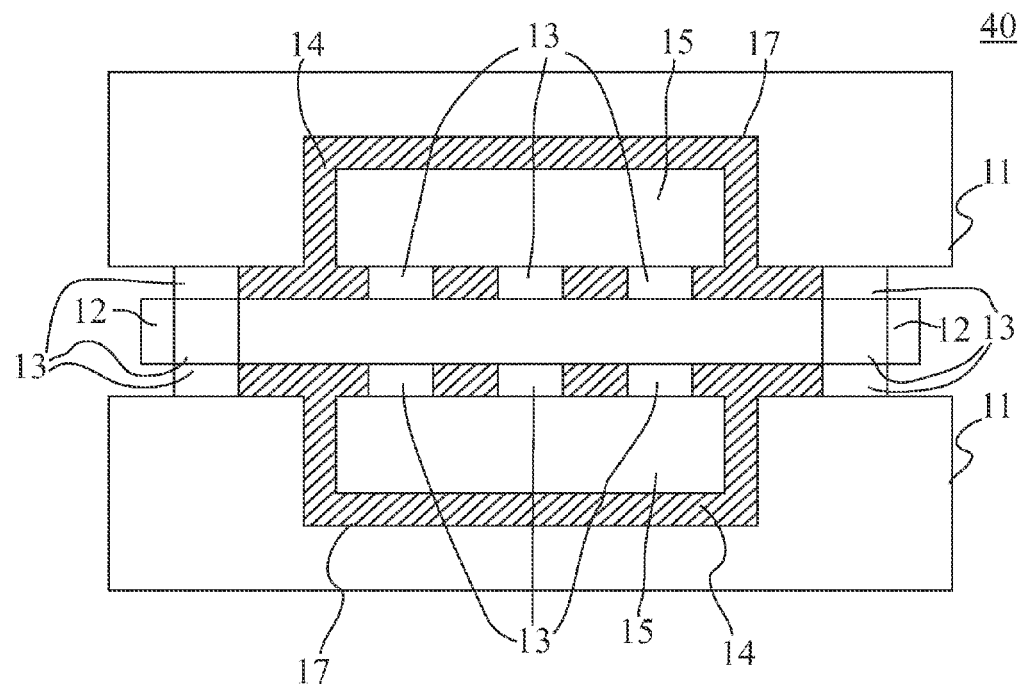
FIG. 1D illustrates one embodiment of the package structure in the present invention.

In one embodiment of the package structure 40 in the present invention, as illustrated in FIG. 1D, the device carriers 11 can be disposed on both top surface and bottom surface of the substrate 12. There can be at least one recess 17, in which a conductive element 15 is disposed, in the device carrier 11 on top surface of the substrate 12. The features described above can also be applied to the structure 40 in FIG. 1D.

Figure 1E:
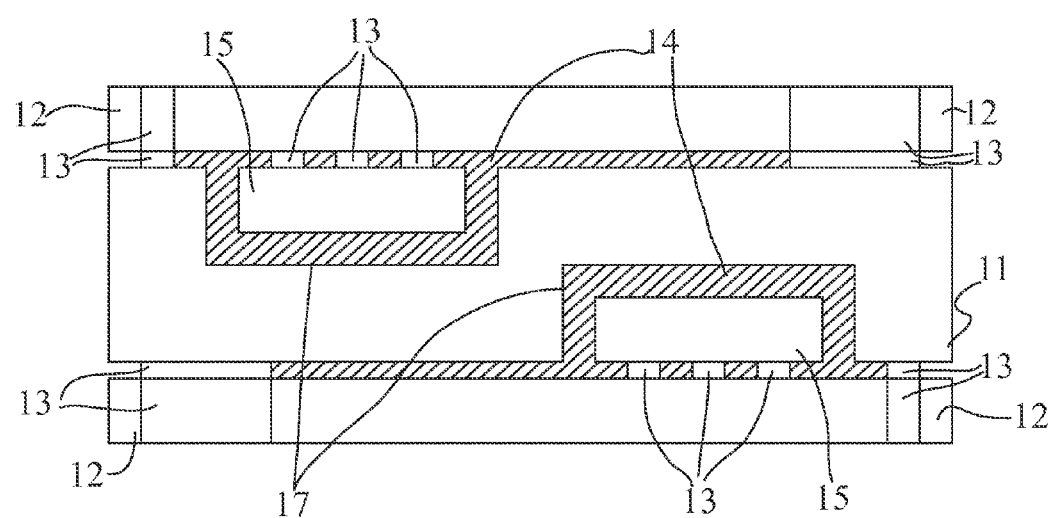
FIG. 1E illustrates another embodiment of the package structure in the present invention.

In another embodiment of the package structure 50 in the present invention, as illustrated in FIG. 1E, the substrates 12 can be disposed on both top surface and bottom surface of the device carrier 11.

Figure 2:
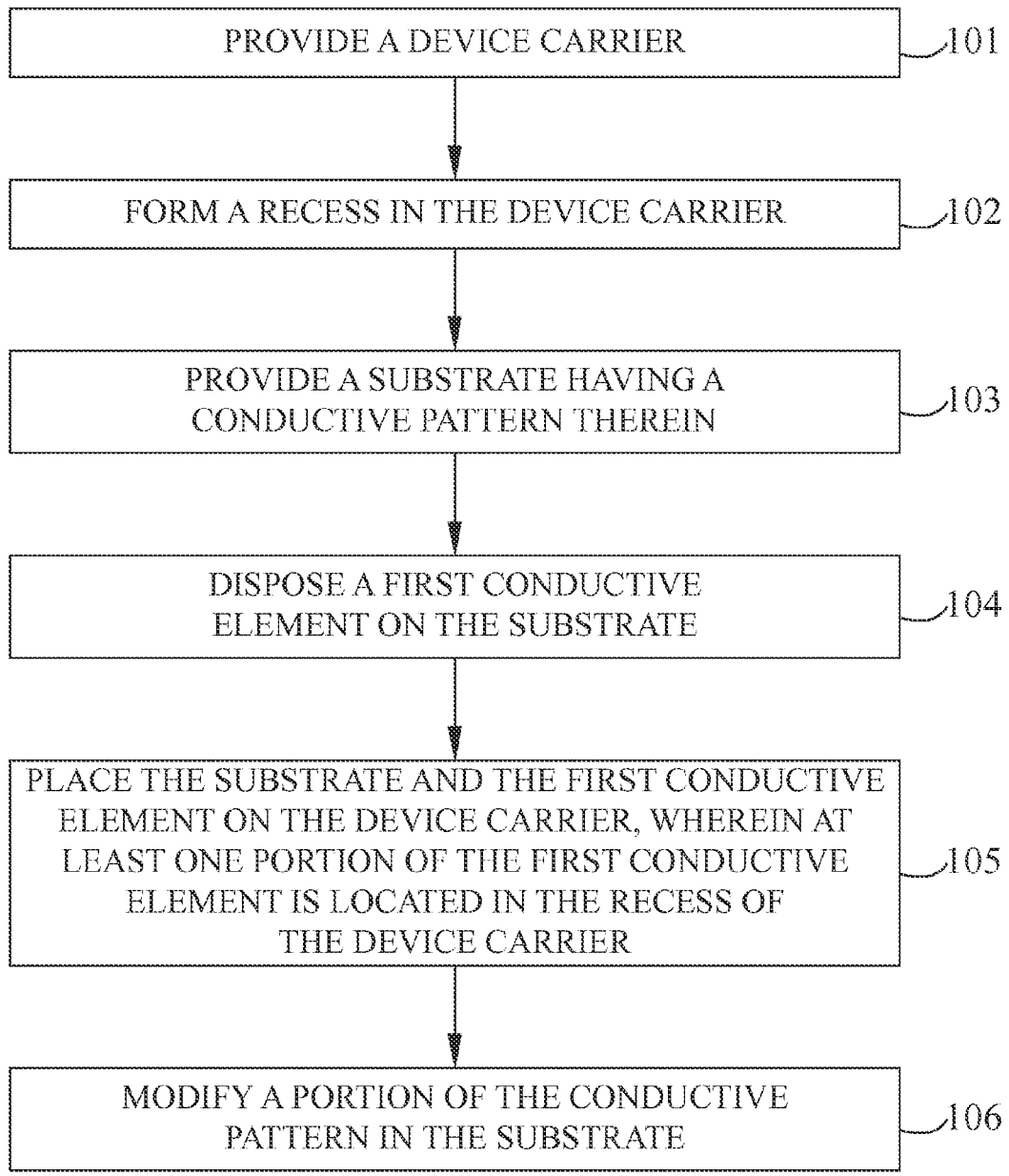
FIG. 2 illustrates the process flow of manufacturing a package structure in FIG. 1A or in FIG. 1B.

FIG. 2 is the process flow of manufacturing a package structure 10 in FIG. 1A or a package structure 20 in FIG. 1B.

In step 101, provide a device carrier 11. A device carrier 11 has a conductive pattern (not shown) therein and a plurality of pads (as I/O terminals) (not shown) for external electrical connection. The conductive pattern (not shown) can be on the device carrier 11 or underlying the device carrier 11.

In step 102, form a recess 17 in the device carrier 11. In step 103, provide a substrate 12 with a conductive pattern 13 therein. In step 104, dispose a first conductive element 15 on the substrate 12. In one embodiment, a first conductive element 15 and a second conductive element 18 can be mounted on opposite surfaces of the substrate 12.

In step 105, place the substrate 12 and the first conductive element 15 on the device carrier 11, wherein at least one portion of the first conductive element 15 is located in the recess 17 of the device carrier 11. The conductive pattern 13 in the substrate 12 is electrically connected to the device carrier 11 and at least one I/O terminal of the first conductive element 15. In one embodiment, place the substrate 12, the first conductive element 15 and the second conductive element 18 on the device carrier 11, wherein at least one portion of the first conductive element 15 is located in the recess 17 of the device carrier 11. The conductive pattern 13 in the substrate 12 is electrically connected to the device carrier 11, at least one I/O terminal of the first conductive element 15 and at least one I/O terminal of the second conductive element 18. The device carrier 11 and the substrate 12 can be combined by conventional technology, such as soldering or connector. An insulating layer 14 is formed between the device carrier 11 and the substrate 12. The insulating layer 14 is also filled in the recess 17 of the device carrier 11 and encapsulates the first conductive element 15. Then, form a plurality of pads underlying the device carrier 11 or on the substrate 12, and dispose at least one second conductive element 18 on the substrate 12.

In step 106, modify a portion of the conductive pattern 13 in the substrate 12. The substrate 12 is a modifiable or replaceable substrate. In one embodiment, if there is a failure of the conductive pattern 13 in the substrate 12, the substrate 12 can be removed (by desoldering or disconnecting) and a portion of the conductive pattern 13 in the substrate 12 can be repaired or modified. Then, the substrate 12 can be re-combined with the device carrier 11. In one embodiment, a portion of the conductive pattern 13 in the substrate 12 can be repaired or modified without removing the substrate 12 from the package structure. In one embodiment, if the conductive pattern 13 in the substrate 12 needs to be changed or modified, the substrate 12 can be replaced with another substrate (not shown) having another conductive pattern (not shown) therein in order to fix errors or enhance performance. The conductive pattern (not shown) in another substrate (not shown) is electrically connected to the device carrier 11 and said at least one first I/O terminal of the first conductive Element 15.

In one embodiment, when the substrate 12 is removed from the package structure, the first conductive element 15 and the substrate 12 can be also removed together. In one embodiment, only the substrate 12 is removed from the package structure. In one embodiment, when the substrate 12 is removed from the package structure, the second conductive element 18 and the substrate 12 can be also removed together.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A package structure, comprising:
   a lead frame comprising a metal body and a plurality of pins insulated from each other,
      wherein the metal body of the lead frame has a recess therein,
   a substrate having conductive pattern layers therein;
      a first conductive element having a top surface and a bottom surface, wherein a first plurality of I/O terminals are disposed on the top surface of the first conductive element, wherein the first conductive element is disposed on the bottom surface of the substrate with said first plurality of I/O terminals electrically connected to the substrate, wherein the substrate is disposed over the lead frame and at least one portion of the first conductive element that includes the bottom surface of the first conductive element is located in the recess of the lead frame; and the plurality of pins of the lead frame are electrically connected to said first plurality of I/O terminals of the first conductive element via the conductive layers of the substrate, wherein there is not any I/O terminal that is disposed on the bottom surface of the first conductive element and electrically connected to the lead frame: and an insulating layer, disposed on the top surface of lead frame, wherein said insulating layer is encompassed entirely between the outermost conductive layers of the substrate that are mounted on the top surface of the lead frame when viewed from a plan view.

2. The package structure according to claim 1, wherein the substrate is a replaceable substrate.

3. The package structure according to claim 1, wherein the substrate is a PCB or a ceramic substrate.

4. The package structure according to claim 1, wherein the substrate comprises a metallic plate, wherein the metallic plate is electrically coupled to one of the plurality of pins.

5. The package structure according to claim 1, further comprising: a second conductive element having at least one second I/O terminal, disposed on the top surface of the substrate, wherein the conductive layers of the substrate are electrically connected to said at least one second I/O terminal of the second conductive element.

6. The package structure according to claim 1, further comprising: a vacancy in the substrate; and a second conductive element having at least one second I/O terminal, disposed in the vacancy of the substrate, wherein the conductive layers of the substrate are electrically connected to said at least one second I/O terminal of the second conductive element.

7. A package structure, comprising: a lead frame comprising a metal body and a plurality of pins insulated from each other, wherein a recess is formed in the metal body of the lead frame, a substrate having conductive layers therein a first conductive element having a plurality of terminals, disposed on the bottom surface of the substrate with the plurality of terminals electrically connected to the substrate wherein the substrate is disposed over the lead flame with at least one portion of the first conductive element disposed in the recess of the lead frame; and wherein the plurality of pins of the lead flame are electrically connected to the plurality of terminals of the first conductive element via the at least one conductive layers of the substrate and an insulating layer, disposed on the top surface of lead frame, wherein said insulating layer is encompassed entirely between the outermost conductive layers of the substrate that are mounted on the top surface of the lead frame when viewed from a plan view.

8. The package structure according to claim 7, wherein the substrate is a replaceable substrate.

9. The package structure according to claim 7, wherein the substrate is a PCB or a ceramic substrate.

10. The package structure according to claim 7, further comprising: a second conductive element having at least one second I/O terminal, disposed on the top surface of the substrate, wherein the conductive layers of the substrate are electrically connected to said at least one second I/O terminal of the second conductive element.

11. The package structure according to claim 7, wherein the substrate comprises a metallic plate, wherein the metallic plate is electrically coupled to one of the plurality of pins.

* * * * *